United States Patent [19]

Bradley

[11] Patent Number: 4,818,823
[45] Date of Patent: Apr. 4, 1989

[54] ADHESIVE COMPONENT MEANS FOR ATTACHING ELECTRICAL COMPONENTS TO CONDUCTORS

[75] Inventor: Robert F. Bradley, New Buffalo, Mich.

[73] Assignee: Micro-Circuits, Inc., New Buffalo, Mich.

[21] Appl. No.: 70,343

[22] Filed: Jul. 6, 1987

[51] Int. Cl.⁴ ............................................. H05K 1/18
[52] U.S. Cl. ............................. 174/68.5; 174/117 A; 361/400; 361/405
[58] Field of Search ............... 361/400, 404, 405, 403, 361/406; 174/117 A, 68.5

[56] References Cited

U.S. PATENT DOCUMENTS

| | | | |
|---|---|---|---|
| 3,075,705 | 1/1963 | Wilhelm | 174/117 A |
| 3,192,307 | 6/1965 | Lazar | 361/404 X |
| 3,344,316 | 9/1967 | Stelmak | 361/405 |
| 3,762,946 | 10/1973 | Stow et al. | 174/117 A |
| 4,339,785 | 7/1982 | Ohsawa | 361/400 X |
| 4,349,860 | 9/1982 | Ohsawa | 361/405 X |
| 4,489,487 | 12/1984 | Bura | 361/400 |
| 4,635,165 | 1/1987 | Okuaki | 361/400 |
| 4,635,354 | 1/1987 | Chrobak et al. | 361/404 X |
| 4,673,967 | 6/1987 | Hingorany | 361/405 X |
| 4,694,572 | 9/1987 | Leber et al. | 174/68.5 X |
| 4,744,850 | 5/1988 | Imano et al. | 174/117 A X |

Primary Examiner—R. R. Kucia
Attorney, Agent, or Firm—James D. Hall

[57] ABSTRACT

A surface mounting method which utilizes an adhesive component to mount the electrical components to a printed circuit board instead of solder and which includes the use, between the contacting surfaces, of a flowable, corrosion-resistant material which bridges contact imperfections and penetrates surface films. The method may also be implemented to connect two electrical conductors.

3 Claims, 1 Drawing Sheet

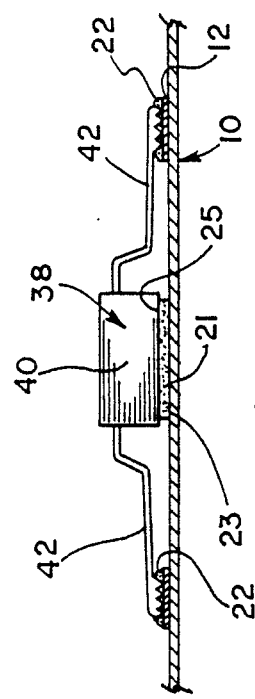
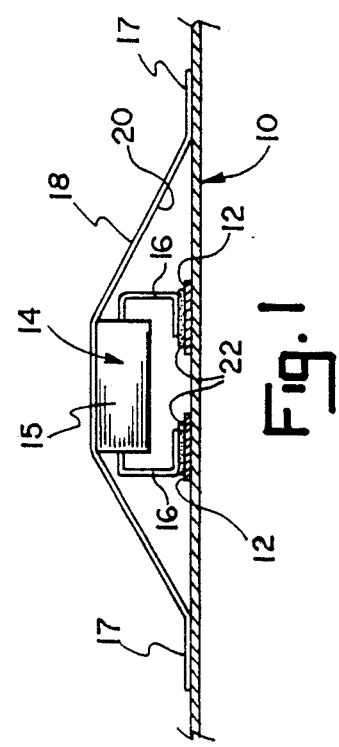
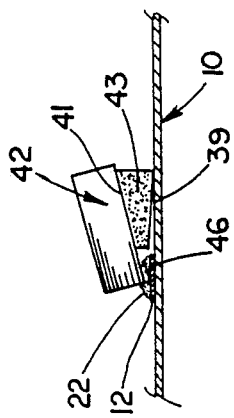
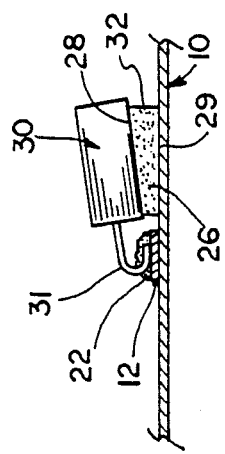
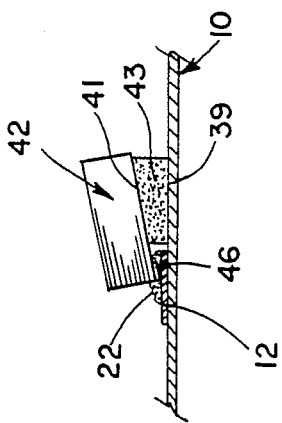

ADHESIVE COMPONENT MEANS FOR ATTACHING ELECTRICAL COMPONENTS TO CONDUCTORS

BACKGROUND OF THE INVENTION

This invention relates to means for surface mounting electrical components to a printed circuit board and will have special application to mounting electrical components by an automatic production line.

One of the most advanced changes taking place in electronics is miniaturization, the most important result of which is to place more functions in a given space. The previously employed methods of mounting chips and other components on a printed circuit board, that is, by extending leads from the components through holes in the boards and then soldering them to the reverse side, are no longer practical in most applications.

Very recently, the concept of surface mounting has been introduced. This concept has many advantages over the previous methods. The size of the boards can be greatly reduced, storage space is appreciably reduced, fewer assembly machines are required and other factors result in a major reduction in overall costs.

However, surface mounting retains one major disadvantage in that leads still must be soldered in order to connect the component to the board. Additionally, there are difficulties in positioning the chip contacts over very closely spaced board contacts and in soldering the very small connections without bridging and board warping, which can either prevent all contacts from properly connecting or can break the delicate contacts later.

As mentioned above, and more specifically, mounting techniques for connecting electrical components to the surface of a printed circuit board;s conductive pads have utilized either a wave soldering or a fluorocarbon vapor and solder paste method. Each of these methods require an extremely high temperature, typically around 500 degrees fahrenheit, to effect the attachment of a component's leads to the conductive pad. The problem involved in the use of these methods is that the high temperature creates a hostile environment for the electronic components which results in a high component breakage rate. Another problem associated with the above methods is the high cost involved in an attempt to minimize the shock effects of the high temperature. The components are slowly brought up in temperature to within 50 degrees of the soldering medium and after being soldered are slowly lowered in temperature to the ambient temperature. The heating and cooling of the components reduces the rejection rate but increased the cost of the product due to the added cost of heating and cooling the units.

These methods, however, have a distinct advantage in that the soldering of the electrical component leads results in a connection which, because of the solder, is clean, sure and corrosion resistant.

Instead of using heat to effect the connection, this invention uses a pressure sensitive adhesive and an electrically conductive medium to mechanically and electrically attach the component in place, thereby removing the expense and component rejection associated with methods utilizing a high heat source.

SUMMARY OF THE INVENTION

This invention has practical use in a variety of situations requiring an electrical connection between two conductors and has special application to the connection of a component lead to the surface of a conductive pad of a printed circuit board.

In accordance with this invention, a cold method for mechanically and electrically attaching an electrical component to a printed circuit board conductive pad is provided. Such cold method includes a bonding element to mechanically attach an electrical component to the surface of a printed circuit board and a conducting medium to promote electron current flow between the lead of the component and the conductive pad of the circuit board.

The conducting medium is particularly important because, without it, the contact surfaces are subject to corrosion. Due to the fact that the contact surfaces are exposed, this method will not be practical without the conducting medium. The medium must be a flowable, metal-pigmented and corrosion-resistant material which bridges contact imperfections and penetrates surface films.

Accordingly, it is an object of this invention to provide for means of electrical component attachment which can be implemented without the use of added heat.

Another object of this invention is to provide means of electrical component attachment which enables easier component placement and replacement than conventional methods.

DESCRIPTION OF THE DRAWINGS

FIG. 1 is an elevational view of the invention implemented across a component.

FIG. 2 is an elevational view of the invention implemented under a component. illustrates component 14 having conductive FIG. 3 is an elevational view of the invention implementing wedge-shaped member under the component.

FIG. 4 is an elevational view of the invention also combining a wedge shaped member under the component.

FIG. 5 is an elevational view of the invention as depicted in FIG. 4 after the component has been pressed into its final position, the wedge shaped member being shown fully connecting the component to the board.

DESCRIPTION OF THE PREFERRED EMBODIMENT

The first embodiment of the invention shown in FIG. 1 illustrates component 14 having conductive legs 16 formed in a J-lead configuration and being secured to printed circuit board 10 by a resilient strip 18 which extends over the top of body 15 of the component. Strip 18 with an adhesive side 20 is pressed into contact and secured at ends 17 to board 10. This draws component 14 toward board 10 with legs 16 contacting conductive pads 12 of the circuit board. Electrical conductive-enhancing and protective material 22, disclosed in commonly owned U.S. Pat. No. 4,578,215 incorporated herein by reference, had been previously applied to legs 16 at their looped ends for contact with board pad 12 to enhance current flow and prevent the oxidation of the component legs and conductive pads.

To remove component 14 for replacement, resilient strip 18 is pulled loose from the board 10. Component 14 can then be pulled off strip 18 and replaced with a new component which is attached to strip 18 and placed onto board 10. The components 38 and 30 of FIGS. 2 and 3 can be similarly replaced.

A variation of the present embodiment is depicted in FIG. 2 having resilient strip 21 with opposite adhesive sides 23, 25 positioned between component 38 and board 10. Strip 21 is attached to the body 40 of a component 38 at side 25 and is then pressed into contact with board 10 at side 23. Resilient strip 21 serves to draw component 38 toward board 10 with legs 42 contacting conductive pads 12. Conductive legs 42 are shown in a gull wing configuration with cupped saw-tooth ends to aid in obtaining a good electrical connection with board 10. As with the form shown in FIG. 1, conductive medium 22 is used between board pads 12 and component legs 42. Indeed, it will be noted that conductive medium 22 is shown and depicted in every figure at every contact point. As previously explained, this is critical to and essential for, the proper operation of this improvement in electrical component attachment.

FIG. 3 shows a further variation of the present embodiment in conjunction with a component 30, such as a ceramic chip type capacitor. A resilient wedge 26 with opposite adhesive sides 28,29 is placed between component 30 and board 10 with its lead 31 and conductive board pad 16 as in the above described variations.

FIGS. 4 and 5 depict a variation of the present invention in conjunction with a component 42, such as a leadless ceramic chip type capacitor. Resilient wedge 43, with opposite adhesive sides 41 and 39, is placed between component 42 and board 10. Contact 46 has had material 22 applied as mentioned above. To mount component 42 to board 10 resilient wedge 43 with opposite adhesive sides 41 and 39 is first secured to component 42. The wedge and component combination is then lowered into position with lead 46 contacting board contact 12. As shown in FIG. 4 upon initial contact between the component lead and and board contact, a small space exists between a portion of surface 37 and board 10. Further downward pressure compresses wedge 43 to allow full adhesion of surface 39 to board 10 thus pivotally forcing lead 46 into a secure contact with board contact 12 as shown in FIG. 5. Wedge 43 aids in the securing of component 42 and provides the proper spacing between board 10 and component 42 as required.

The ease of replacement of a component attached by the above means reduces the cost typically involved in the prior art method of surface mounting components by reducing component breakage caused by the high temperatures required and eliminating the cost of pre and post heating of the components.

It is to be understood that the scope of the invention is not limited to the above description, but may be modified within the scope of the appended claims.

I claim:

1. In combination, an adhesive member and a contact enhancing material for cold forming an electrical and mechanical connection between an electrical component having a body and conductive lead and a printed circuit board having a conductive pad, said conductive lead of said electrical component contacting conductive pad of said printed circuit board, said contact enhancing material located between said pad and said lead, said adhesive member located between said printed circuit board and said electrical component body to mechanically connect said electrical component to said printed circuit board, said adhesive member being a resilient strip having an adhesive coating on at least one side, said contact enhancing material being a flowable metal-pigmented corrosion resistant material carried by said lead.

2. The combination of claim 1 wherein said resilient strip has an adhesive coating on opposite contacting surfaces and is positioned between said electronic component body and said board.

3. The combination of claim 2 wherein said resilient strip is of a tapered cross section.

* * * * *